(12) United States Patent
Wu et al.

(10) Patent No.: US 9,100,079 B2
(45) Date of Patent: Aug. 4, 2015

(54) WIRELESS TRANSCEIVER AND METHOD OF CONTROLLING THE WIRELESS TRANSCEIVER

(71) Applicant: MEDIATEK INC., Hsin-Chu (TW)

(72) Inventors: Chia-Hsin Wu, New Taipei (TW); Hui-Hsien Liu, Hsinchu (TW); Chien-Cheng Lin, Taichung (TW); Albert Chia-Wen Jerng, Los Gatos, CA (US); George Chien, Saratoga, CA (US)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 44 days.

(21) Appl. No.: 14/144,593

(22) Filed: Dec. 31, 2013

(65) Prior Publication Data

US 2014/0295774 A1 Oct. 2, 2014

Related U.S. Application Data

(60) Provisional application No. 61/806,602, filed on Mar. 29, 2013.

(51) Int. Cl.
| | |
|---|---|
| *H04B 1/40* | (2006.01) |
| *H04B 1/10* | (2006.01) |
| *H04B 1/401* | (2015.01) |
| *H04B 1/04* | (2006.01) |

(52) U.S. Cl.
CPC .................. *H04B 1/10* (2013.01); *H04B 1/401* (2013.01); *H04B 2001/0433* (2013.01)

(58) Field of Classification Search
CPC ... H04B 1/401; H04B 1/10; H04B 2001/0433

USPC .......................................... 455/73, 78, 83, 88
See application file for complete search history.

(56) References Cited

U.S. PATENT DOCUMENTS

| | | | | |
|---|---|---|---|---|
| 4,153,877 | A * | 5/1979 | Fathauer et al. | 455/76 |
| 7,706,761 | B2 * | 4/2010 | Seo | 455/127.2 |
| 7,904,108 | B2 * | 3/2011 | Castaneda et al. | 455/550.1 |
| 8,114,044 | B2 * | 2/2012 | Cull | 604/9 |
| 8,369,807 | B2 * | 2/2013 | Mikhemar et al. | 455/130 |

(Continued)

OTHER PUBLICATIONS

Chungyeol Paul Lee, A MultiStandard, Multiband SoC with Integrated BT, FM, WLAN Radios and Integrated Power Amplifier, Feb. 10, 2010, 454-455 and Figure 25.3.7, ISSCC 2010 / Session 25 / Wireless Connectivity / 25.3.

*Primary Examiner* — Marceau Milord
(74) *Attorney, Agent, or Firm* — Winston Hsu; Scott Margo

(57) ABSTRACT

A transceiver includes: a first transforming network arranged for using a first input impedance to receive a first modulated signal and using a first output impedance to output a first transformed signal during a transmitting mode of a first communication standard, and for using the first input impedance to receive a second modulated signal and using a second output impedance to output a second transformed signal during the transmitting mode of a second communication standard; a second transforming network arranged for using a second input impedance to receive the second transformed signal and using a third output impedance to output a first RF signal to a connecting port of the transceiver during the transmitting mode of the second communication standard; a power amplifier, arranged to generate a second RF signal; and a switching circuit for selectively coupling the second transformed signal to the second transforming network.

24 Claims, 8 Drawing Sheets

(56) References Cited

U.S. PATENT DOCUMENTS

| | | | |
|---|---|---|---|
| 8,483,628 B2 * | 7/2013 | Mirzaei et al. | 455/78 |
| 8,565,711 B2 * | 10/2013 | Mirzaei et al. | 455/339 |
| 8,725,085 B2 * | 5/2014 | Darabi et al. | 455/78 |
| 2009/0239471 A1 | 9/2009 | Tran | |

\* cited by examiner

WIRELESS TRANSCEIVER AND METHOD OF CONTROLLING THE WIRELESS TRANSCEIVER

CROSS REFERENCE TO RELATED APPLICATIONS

This application claims the benefit of U.S. Provisional Application No. 61/806,602, which was filed on Mar. 29, 2013 and is included herein by reference.

BACKGROUND

The present invention relates to a wireless transceiver and a method of controlling the wireless transceiver, and more particularly to a transceiver capable of handling different communication standards and a control method thereof.

Industrial, scientific and medical (ISM) radio bands are radio bands reserved internationally for the use of radio frequency (RF) energy for industrial, scientific and medical purposes other than telecommunications. In the field of wireless communication, the ISM band of 2.4 GHz is often used by different wireless technology standards, e.g. Bluetooth technology and WiFi technology. Even if the frequency band is crowded by different wireless technology standards, using the TDD (Time-Division Duplexing) technique to separate the operations of the Bluetooth communication and the WiFi communication into different time slots is still the main solution on the market because of the robustness of the integration. However, the chip area occupied by the two systems in a device is still large because the Bluetooth system and the WiFi system are hard to be integrated due to the different required impedances used therein, different output power levels, etc. Therefore, providing a more compact solution to reduce the cost of the above-mentioned device is an urgent problem in the wireless communication field.

SUMMARY

One of the objectives of the present embodiment is to provide a low cost transceiver capable of handling different communication standards and a control method thereof.

According to a first embodiment of the present invention, a transceiver is provided. The transceiver comprises a first transforming network, a second transforming network, a power amplifier, and a switching circuit. The first transforming network has a first input impedance, a first output impedance, and a second output impedance, and is arranged for using the first input impedance to receive a first modulated signal and using the first output impedance to output a first transformed signal during a transmitting mode of a first communication standard, and for using the first input impedance to receive a second modulated signal and using the second output impedance to output a second transformed signal during the transmitting mode of a second communication standard. The second transforming network has a second input impedance and a third output impedance, and is arranged for using the second input impedance to receive the second transformed signal and using the third output impedance to output a first RF signal to a connecting port of the transceiver during the transmitting mode of the second communication standard. The power amplifier is arranged to generate a second RF (Radio frequency) signal to the connecting port of the transceiver according to the first transformed signal during the transmitting mode of the first communication standard. The switching circuit is coupled between the first transforming network and the second transforming network for coupling the second transformed signal to the second transforming network during the transmitting mode of the second communication standard, and not coupling the second transformed signal to the second transforming network during the transmitting mode of the first communication standard.

According to a second embodiment of the present invention, a transceiver is provided. The transceiver comprises a first transforming network, a power amplifier, and a switching circuit. The first transforming network is arranged to transform a first modulated signal into a first transformed signal according to a first winding turns ratio during a transmitting mode of a first communication standard, and transform a second modulated signal into a second transformed signal according to a second winding turns ratio during the transmitting mode of a second communication standard. The power amplifier is arranged to generate a first RF (Radio frequency) signal to a connecting port of the transceiver according to the first transformed signal during the transmitting mode of the first communication standard. The switching circuit is coupled between the first transforming network and the connecting port, for coupling the second transformed signal to the connecting port during the transmitting mode of the second communication standard, and not coupling the second transformed signal to the connecting port during the transmitting mode of the first communication standard.

According to a third embodiment of the present invention, a method of controlling a transceiver is provided. The method comprises: when the transceiver operates under a first communication standard: using a first transforming network to transform a first modulated signal into a first transformed signal according to a first winding turns ratio during a transmitting mode; and using a power amplifier to generate a first RF (Radio frequency) signal to a connecting port of the transceiver according to the first transformed signal during the transmitting mode; and when the transceiver operates under a second communication standard: using the first transforming network to transform a second modulated signal into a second transformed signal according to a second winding turns ratio during the transmitting mode; and coupling the second transformed signal to the connecting port during the transmitting mode; wherein the second transformed signal is not coupled to the connecting port during the transmitting mode of the first communication standard.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
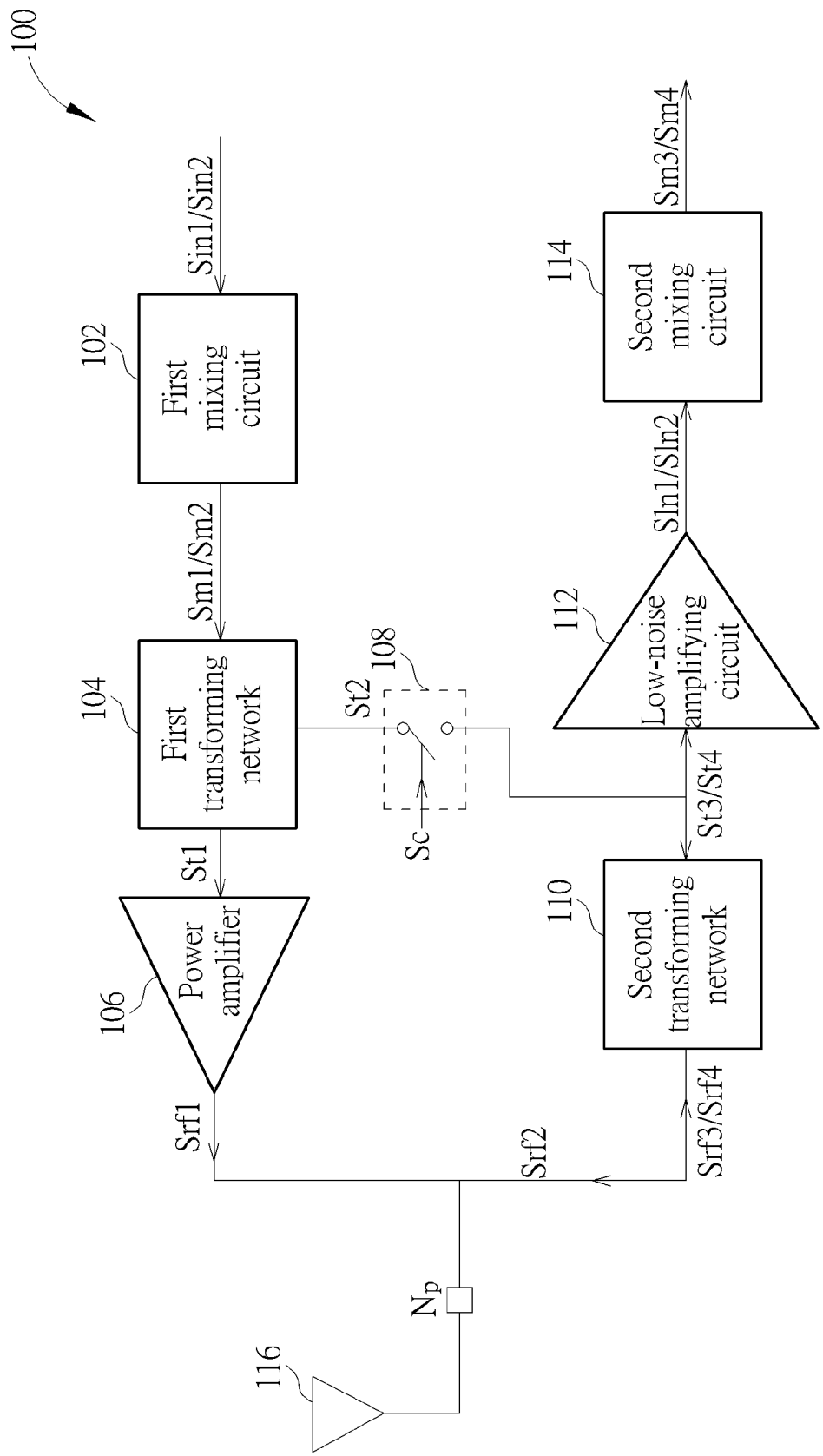
FIG. 1 is a diagram illustrating a transceiver according to a first embodiment of the present invention.

Please refer to FIG. 1, which is a diagram illustrating a transceiver 100 according to a first embodiment of the present invention. The transceiver 100 is arranged to transmit/receive signals of two wireless technology standards, e.g. a Bluetooth signal and a WiFi signal, non-concurrently. It is noted that the Bluetooth signal and the WiFi signal are not a limitation of the present invention. The reason for using the Bluetooth signal and the WiFi signal as the example of this embodiment is because the Bluetooth signal and the WiFi signal occupy the same ISM band, which is the band around the frequency of 2.4 GHz. In other words, any other two wireless technology standards which occupy the same ISM band can also be integrated into a single-chip transceiver by using the techniques disclosed in the present claims.

The transceiver 100 comprises a first mixing circuit 102, a first transforming network 104, a power amplifier 106, a switching circuit 108, a second transforming network 110, a low-noise amplifying circuit 112, and a second mixing circuit 114. An antenna 116 is also shown in FIG. 1 to more clearly illustrate the transceiver 100. According to the exemplary embodiment, the first mixing circuit 102, the first transforming network 104, the power amplifier 106, the switching circuit 108, the second transforming network 110, the low-noise amplifying circuit 112, and the second mixing circuit 114 are configured as a single chip or a system-on-chip (SOC). The first mixing circuit 102 is arranged to generate a first modulated signal Sm1 according to a first input signal Sin1 during the transmitting mode of the first communication standard and generate a second modulated signal Sm2 according to a second input signal Sin2 during the transmitting mode of the second communication standard. It is noted that, for the sake of brevity, the first communication standard is exemplarily referred to as the WiFi standard and the second communication standard is exemplarily referred to as the Bluetooth standard in the following paragraphs, but this is not a limitation of the present invention.

The first transforming network 104 is arranged to transform the first modulated signal Sm1 into a first transformed signal St1 according to a first winding turns ratio NR1 during the transmitting mode of the first communication standard, and transform the second modulated signal Sm2 into a second transformed signal St2 according to a second winding turns ratio NR2 during the transmitting mode of the second communication standard. The power amplifier 106 is arranged to generate a first RF (Radio frequency) signal Srf1 to a connecting port Np of the transceiver 100 according to the first transformed signal St1 during the transmitting mode of the first communication standard. The second transforming network 110 is coupled between the switching circuit 108 and the connecting port Np for transforming the second transformed signal St2 into a second RF signal Srf2 on the connecting port Np during the transmitting mode of the second communication standard. The switching circuit 108 is coupled between the first transforming network 104 and the connecting port Np for coupling the second transformed signal St2 to the connecting port Np during the transmitting mode of the second communication standard, and not coupling the second transformed signal St2 to the connecting port Np during the transmitting mode of the first communication standard.

The second transforming network 110 is further arranged to transform a third RF signal Srf3 received on the connecting port Np into a third transformed signal St3 during a receiving mode of the first communication standard, and transform a fourth RF signal Srf4 received on the connecting port Np into a fourth transformed signal St4 during the receiving mode of the second communication standard. The low-noise amplifying circuit 112 is arranged to receive the third transformed signal St3 to generate a first low-noise signal Sln1 during the receiving mode of the first communication standard, and receive the fourth transformed signal St4 to generate a second low-noise signal Sln2 during the receiving mode of the second communication standard. The second mixing circuit 114 is arranged to generate a third modulated signal Sm3 according to the first low-noise signal Sln1 during the receiving mode of the first communication standard and generate a fourth modulated signal Sm4 according to the second low-noise signal Sln2 during the receiving mode of the second communication standard.

Figure 2:
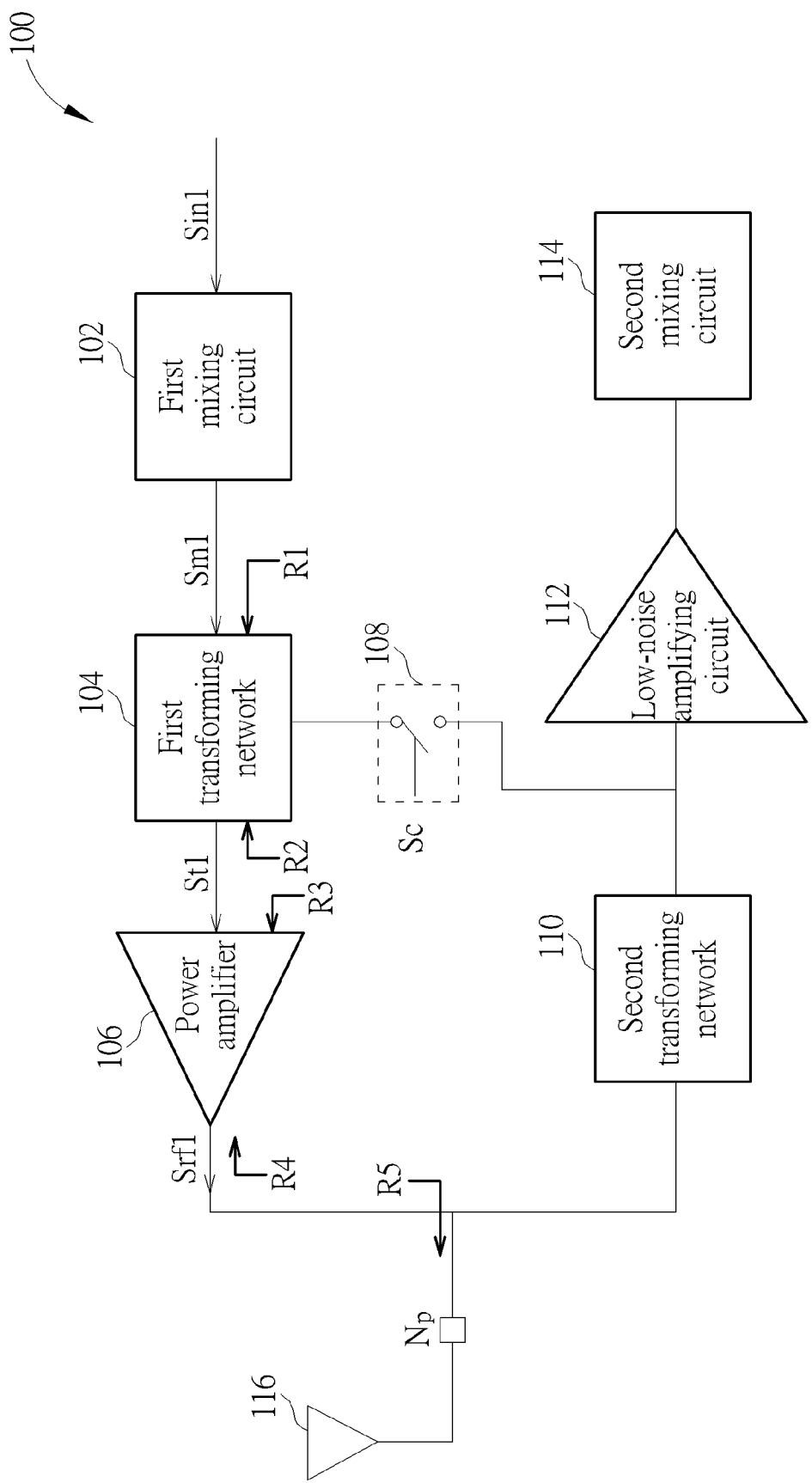
FIG. 2 is a diagram illustrating the connectivity of a transceiver during a transmitting mode of a first communication standard according to an embodiment of the present invention.
Figure 3:
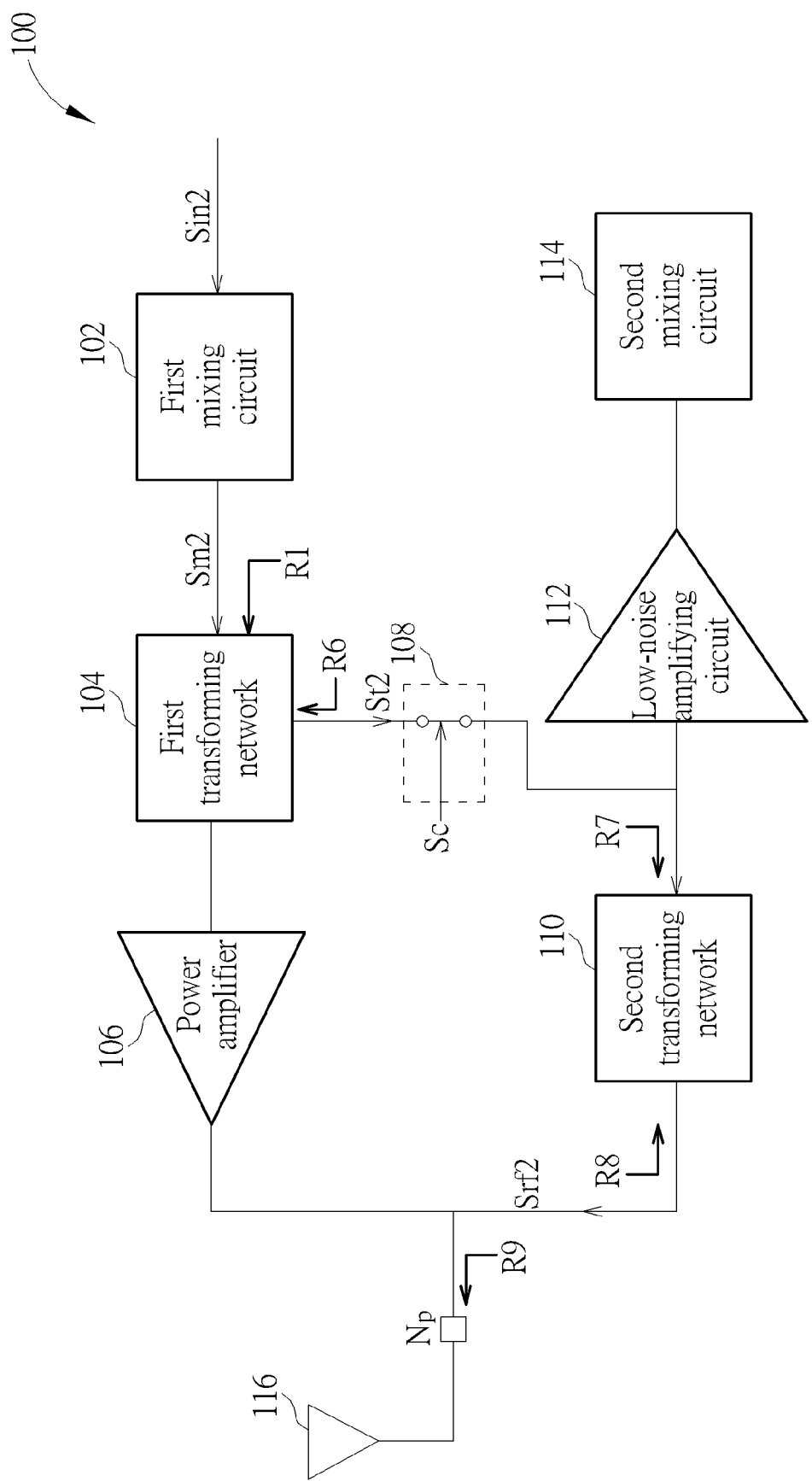
FIG. 3 is a diagram illustrating the connectivity of a transceiver during a transmitting mode of a second communication standard according to an embodiment of the present invention.
Figure 4:
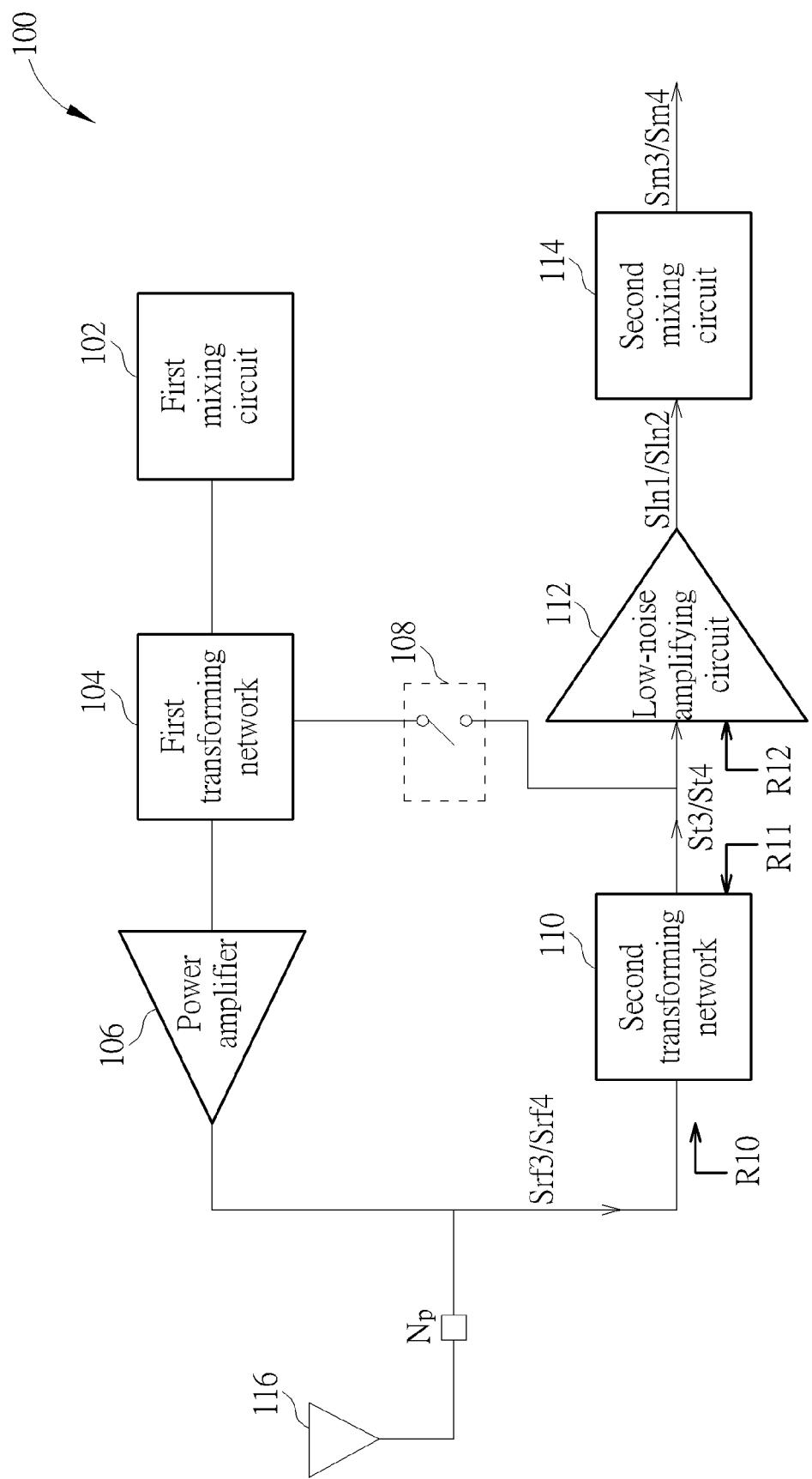
FIG. 4 is a diagram illustrating the connectivity of a transceiver during the receiving modes of first and second communication standards according to an embodiment of the present invention.

The switching circuit 108 is controlled by a control signal Sc, wherein the control signal Sc turns off (i.e. opens) the switching circuit 108 during the transmitting mode of the first communication standard and the receiving modes of the first communication standard and the second communication standard, and the control signal Sc turns on (i.e. closes) the switching circuit 108 during the transmitting mode of the second communication standard. In addition, during the transmitting mode of the first communication standard, the low-noise amplifying circuit 112 and the second mixing circuit 114 are powered off. During the transmitting mode of the second communication standard, the power amplifier 106, the low-noise amplifying circuit 112, and the second mixing circuit 114 are powered off. During the receiving modes of the first communication standard and the second communication standard, the first mixing circuit 102, the first transforming network 104, and the power amplifier 106 are powered off. In other words, during the transmitting mode of the first communication standard, the signal passes from the first mixing circuit 102, the first transforming network 104, and the power amplifier 106 to the antenna 116 as shown in FIG. 2. FIG. 2 is a diagram illustrating the connectivity of the transceiver 100 during the transmitting mode of the first communication standard according to an embodiment of the present invention. During the transmitting mode of the second communication standard, the signal passes from the first mixing circuit 102, the switching circuit 108, and the second transforming network 110 to the antenna 116 as shown in FIG. 3. FIG. 3 is a diagram illustrating the connectivity of the transceiver 100 during the transmitting mode of the second communication standard according to an embodiment of the present invention. During the receiving modes of the first and the second communication standards, the signal is received from the antenna 116, and passes through the second transforming network 110, the low-noise amplifying circuit 112, and the second mixing circuit 114 as shown in FIG. 4. FIG. 4 is a diagram illustrating the connectivity of the transceiver 100 during the receiving modes of the first and the second communication standards according to an embodiment of the present invention.

According to the transceiver 100, the first mixing circuit 102 is concurrently used by the transmitting modes of the first and the second communication standards. The first transforming network 104 is partly concurrently used by the transmitting modes of the first and the second communication standards. The low-noise amplifying circuit 112 and the second mixing circuit 114 are concurrently used by the receiving modes of the first and the second communication standards. Therefore, the chip area of the transceiver 100 is greatly reduced because the transceiver 100 is a highly integrated two-system transceiver in comparison to its conventional counterpart.

According to the transceiver 100, the first transformed signal St1 is amplified by the power amplifier 106 to generate the first RF signal Srf1 while the second transformed signal St2 is transformed by the second transforming network 110 to generate the second RF signal Srf2, therefore the output power of the first RF signal Srf1 is designed to be larger than the output power of the second RF signal Srf2. For the example of when the first communication standard is the WiFi standard and the second communication standard is the Bluetooth standard, the output power of the first RF signal Srf1 during the transmitting mode of the WiFi standard may be around 20 dBm while the output power of the second RF signal Srf2 during the transmitting mode of the Bluetooth standard may be around 10 dBm.

It should be noted that, during the transmitting mode of the WiFi standard, the first modulated signal Sm1 is not limited to transmit to the antenna 116 via the signal path consisted of the first transforming network 104 and the power amplifier 106. The first modulated signal Sm1 can also be transmitted to the antenna 116 via the signal path consisted of the first transforming network 104, the switching circuit 108, and the second transforming network 110 if the output power the first RF signal Srf1 (or the first transformed signal St1) is lower than a predetermined power level. More specifically, during the transmitting mode of the WiFi standard, if the output power of the first RF signal Srf1 is just around or less than 10 dBm, the power amplifier 106 can be turned off. Then, the first modulated signal Sm1 can be transmitted to the antenna 116 via the signal path consisted of the first transforming network 104, the switching circuit 108, and the second transforming network 110. Under this circumstance, the switching circuit 108 is turned on, and the first transforming network 104 is arranged to use the input impedance R1 (see FIG. 3) to receive the first modulated signal Sm1 and to use the output impedance R6 to output a transformed signal to the second transforming network 110 for transforming the transformed signal to the connecting port Np. Accordingly, the power consumption of the transceiver 100 operated under the transmitting mode of the WiFi standard is reduced due to the power-off of the power amplifier 106. As the operation is similar to the operation as shown in FIG. 3, thus the detailed description is omitted for brevity.

In addition, during the transmitting mode of the Bluetooth standard, the second modulated signal Sm2 is not limited to transmit to the antenna 116 via the signal path consisted of the first transforming network 104, the switching circuit 108, and the second transforming network 110. The second modulated signal Sm2 can also be transmitted to the antenna 116 via the signal path consisted of the first transforming network 104 and the power amplifier 106 if the output power the second RF signal Srf2 (or the second transformed signal St2) is higher than a predetermined power level. More specifically, during the transmitting mode of the Bluetooth standard, if the output power of the second RF signal Srf2 is just larger than 10 dBm, the power amplifier 106 can be turned on. Then, the second modulated signal Sm2 can be transmitted to the antenna 116 via the signal path consisted of the first transforming network 104 and the power amplifier 106. Under this circumstance, the switching circuit 108 is open (i.e. turned off), and the first transforming network 104 is arranged to use the input impedance R1 (see FIG. 2) to receive the first modulated signal Sm1 and to use the output impedance R2 to output a transformed signal to the power amplifier 106 for amplifying the transformed signal to the connecting port Np. Accordingly, the output power of the transceiver 100 operated under the transmitting mode of the Bluetooth standard can be increased due to the power-on of the power amplifier 106. As the operation is similar to the operation as shown in FIG. 2, thus the detailed description is omitted for brevity.

Figure 5:
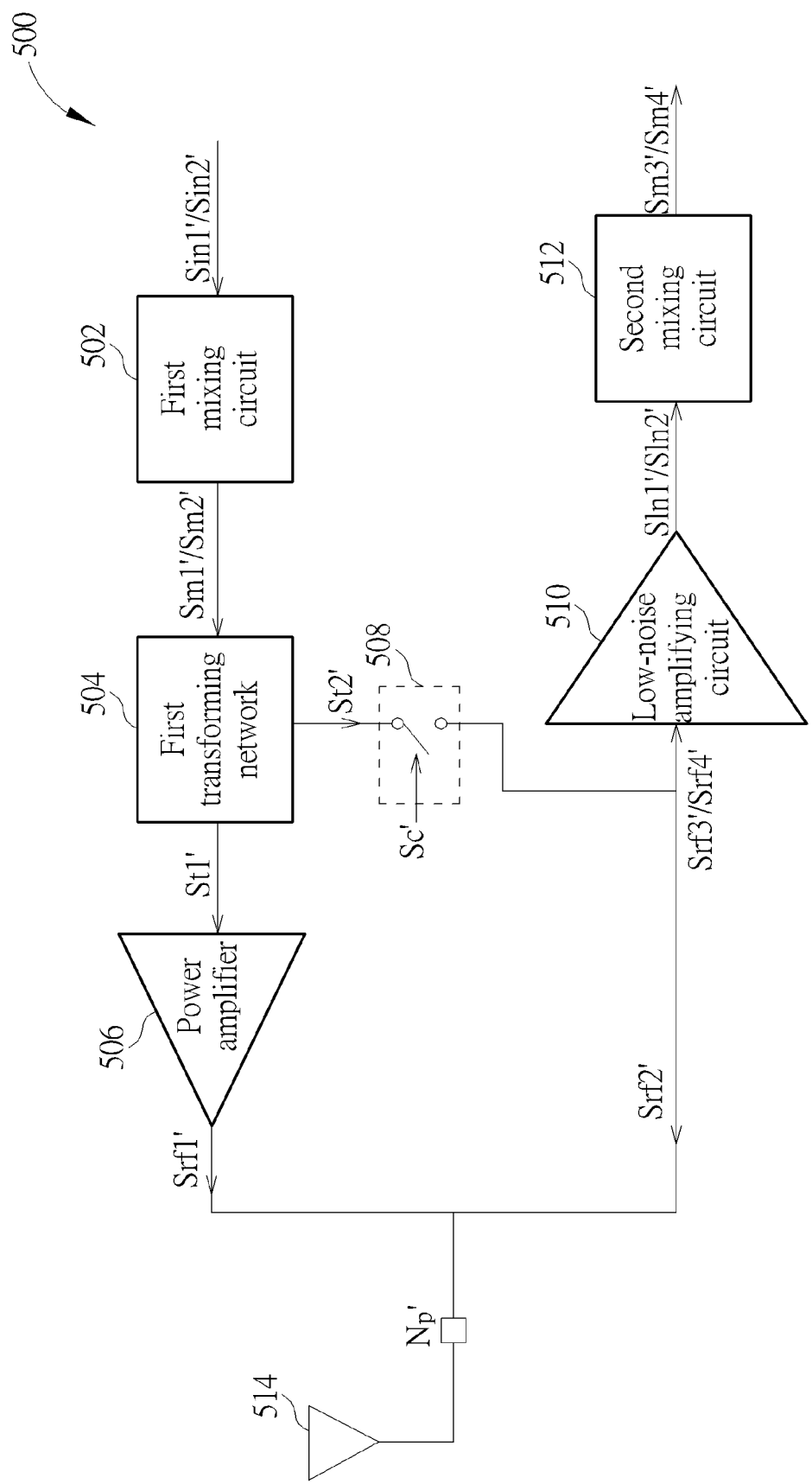
FIG. 5 is a diagram illustrating a transceiver according to a second embodiment of the present invention.

It should be noted that, in another embodiment, the second transforming network 110 may be eliminated if the required output power of the second RF signal Srf2 is low enough during the transmitting mode of the second communication standard or if the impedance between the connecting port and the first mixing circuit 102 can be matched by using merely the first transforming network 104. Please refer to FIG. 5, which is a diagram illustrating a transceiver 500 according to a second embodiment of the present invention. The transceiver 500 is arranged to transmit/receive signals of two wireless technology standards, e.g. the Bluetooth signal and the WiFi signal, non-concurrently. The transceiver 500 comprises a first mixing circuit 502, a transforming network 504, a power amplifier 506, a switching circuit 508, a low-noise amplifying circuit 510, and a mixing circuit 512. An antenna 514 is also shown in FIG. 5 to more clearly illustrate the transceiver 500. According to the exemplary embodiment, the first mixing circuit 502, the transforming network 504, the power amplifier 506, the switching circuit 508, the low-noise amplifying circuit 510, and the second mixing circuit 512 are configured as a single chip or a system-on-chip (SOC).

The first mixing circuit 502 is arranged to generate a first modulated signal Sm1' according to a first input signal Sin1' during the transmitting mode of the first communication standard and generate a second modulated signal Sm2' according to a second input signal Sin2' during the transmitting mode of the second communication standard. The transforming network 504 is arranged to transform the first modulated signal Sm1' into a first transformed signal St1' according to a first winding turns ratio NR1' during the transmitting mode of the first communication standard, and transform the second modulated signal Sm2' into a second transformed signal St2' according to a second winding turns ratio NR2' during the transmitting mode of the second communication standard. The power amplifier 506 is arranged to generate a first RF signal Srf1' to a connecting port Np' of the transceiver 500 according to the first transformed signal St1' during the transmitting mode of the first communication standard. The switching circuit 508 is coupled between the transforming network 504 and the connecting port Np' for coupling the second transformed signal St2' to the connecting port Np' during the transmitting mode of the second communication standard, and not coupling the second transformed signal St2' to the connecting port Np' during the transmitting mode of the first communication standard.

The low-noise amplifying circuit 510 is arranged to receive a third RF signal Srf3' on the connecting port Np' to generate a first low-noise signal Sln1' during the receiving mode of the first communication standard, and receive a fourth RF signal Srf4' on the connecting port Np' to generate a second low-noise signal Sln2' during the receiving mode of the second communication standard. The second mixing circuit 512 is arranged to generate a third modulated signal Sm3' according to the first low-noise signal Sln1' during the receiving mode of the first communication standard and generate a fourth modulated signal Sm4' according to the second low-noise signal Sln2' during the receiving mode of the second communication standard.

The switching circuit 508 is controlled by a control signal Sc', wherein the control signal Sc' turns off (i.e. opens) the switching circuit 508 during the transmitting mode of the first communication standard and the receiving modes of the first communication standard and the second communication standard, and the control signal Sc' turns on (i.e. closes) the switching circuit 508 during the transmitting mode of the second communication standard. In addition, during the transmitting mode of the first communication standard, the low-noise amplifying circuit 510 and the mixing circuit 512 are powered off. During the transmitting mode of the second communication standard, the power amplifier 506, the low-noise amplifying circuit 510, and the mixing circuit 512 are powered off. During the receiving modes of the first communication standard and the second communication standard, the first mixing circuit 502, the transforming network 504, and the power amplifier 506 are powered off. In other words, during the transmitting mode of the first communication standard, the signal passes from the first mixing circuit 502, the transforming network 504, and the power amplifier 506 to the antenna 514. During the transmitting mode of the second communication standard, the signal passes from the first mixing circuit 502 and the switching circuit 508 to the antenna 514. During the receiving modes of the first and the second communication standards, the signal is received from the antenna 514, and passes through the low-noise amplifying circuit 510 and the mixing circuit 512.

According to the transceiver 500, the first mixing circuit 502 is concurrently used by the transmitting modes of the first and the second communication standards. The transforming network 504 is partly concurrently used by the transmitting modes of the first and the second communication standards. The low-noise amplifying circuit 510 and the mixing circuit 512 are concurrently used by the receiving modes of the first and the second communication standards. Therefore, the chip area of the transceiver 500 is greatly reduced because the transceiver 500 is a highly integrated two-system transceiver in comparison to its conventional counterpart.

Please refer to the transceiver 100 in FIG. 1 again. The first transforming network 104 and the second transforming network 110 are designed for solving the impedance matching problem of the signal paths between the connecting port Np and the first mixing circuit 102 and the second mixing circuit 114. More specifically, for the example of when the transceiver 100 operates under the transmitting mode of the first communication standard as shown in FIG. 2, the first transforming network 104 is designed to transform an input impedance R1 into an output impedance R2, wherein the input impedance R1 is a high impedance (e.g. 250 Ohm) and the output impedance R2 is also a high impedance (e.g. 350 Ohm). Therefore, the input impedance R3 (e.g. 350 Ohm) of the power amplifier 106 can be matched to the output impedance R2 of the first transforming network 104. It is noted that, in this exemplary embodiment, the output impedance R4 and the input impedance R5 of the antenna 116 are also matched. For example, the output impedance R4 and the input impedance R5 of the antenna 116 are both 25 Ohm. Accordingly, the first modulated signal Sm1 can be transmitted to the antenna 116 without introducing power loss during the transmitting mode of the first communication standard.

When the transceiver 100 operates under the transmitting mode of the second communication standard as shown in FIG. 3, the first transforming network 104 is designed to transform an input impedance R1 into another output impedance R6, wherein the input impedance R1 is the high impedance (e.g. 250 Ohm) and the output impedance R6 is also an intermediate impedance (e.g. 80 Ohm). The second transforming network 110 is designed to transform an input impedance R7 into an output impedance R8, wherein the input impedance R7 is matched to the output impedance R6 of the first transforming network 104, e.g. 80 Ohm, and the output impedance R8 is matched to the input impedance R9 of the antenna 116, e.g. 25 Ohm. Accordingly, the second modulated signal Sm2 can be transmitted to the antenna 116 without introducing power loss during the transmitting mode of the second communication standard.

In other words, the first transforming network 104 is arranged for using the input impedance R1 to receive the first modulated signal Sm1 and using the output impedance R2 to output the first transformed signal St1 during the transmitting mode of a first communication standard, and for using the input impedance R1 to receive the second modulated signal Sm2 and using the output impedance R6 to output the second transformed signal St2 during the transmitting mode of the second communication standard. The second transforming network 110 is arranged for using the input impedance R7 to receive the second transformed signal St2 and using the output impedance R8 to output the RF signal Srf2 to the connecting port Np of the transceiver during the transmitting mode of the second communication standard.

Similarly, when the transceiver 100 operates under the receiving modes of the first communication standard and the second communication standard as shown in FIG. 4, the second transforming network 110 can be used to transform the input impedance R10 (e.g. 25 Ohm) into the output impedance R11 (e.g. 80 Ohm) in order to match the input impedance R12 (e.g. 80 Ohm) of low-noise amplifying circuit 112. Accordingly, the third RF signal Srf3 and the fourth RF signal Srf4 can be transmitted to the second mixing circuit 114 without introducing power loss during the receiving modes of the first and second communication standards.

It is also noted that the above mentioned transmitting mode of the first communication standard, the transmitting mode of the second communication standard, the receiving mode of the first communication standard, and the receiving mode of the second communication standard are non-concurrent modes of the transceiver 100.

Figure 6:
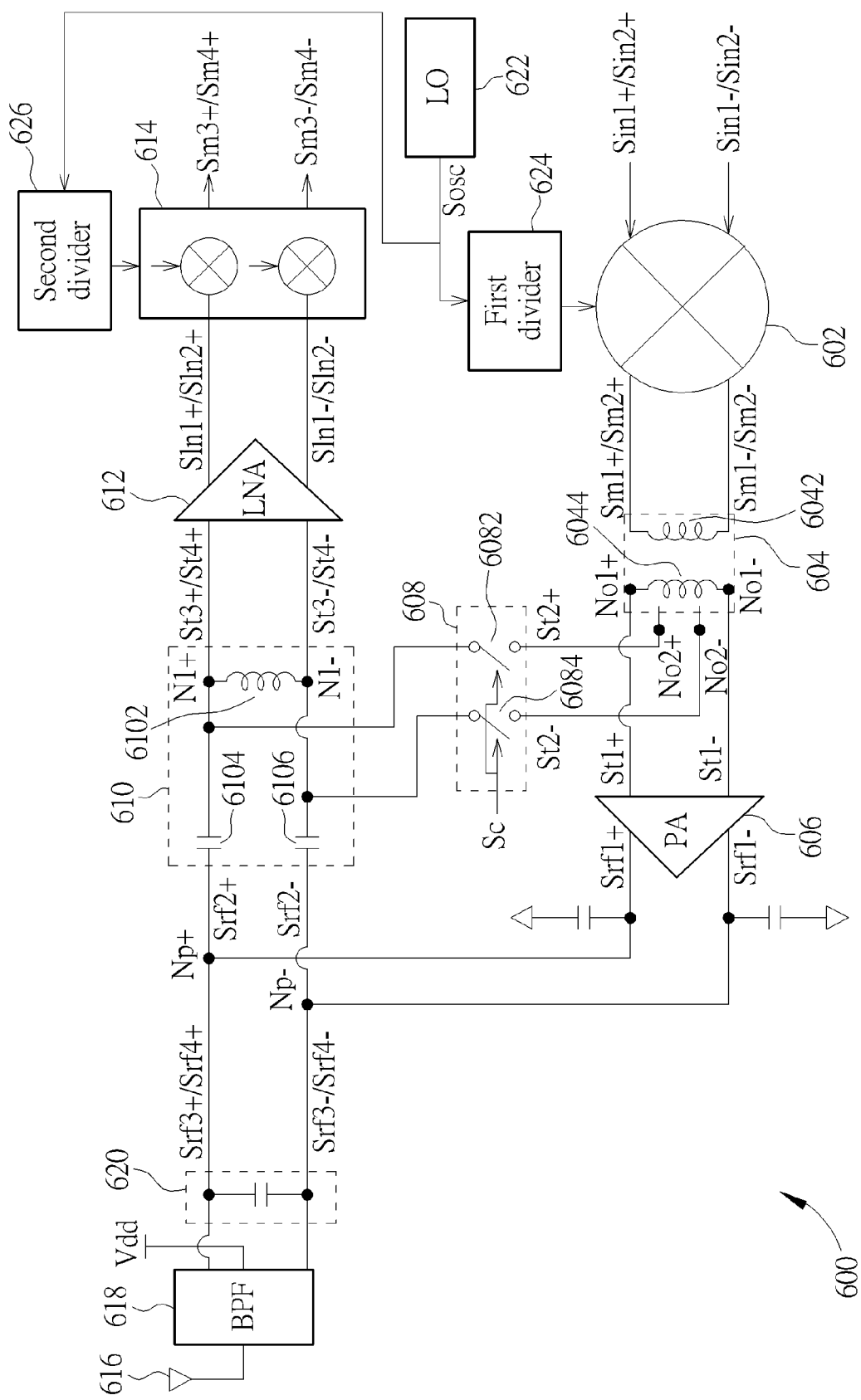
FIG. 6 is a diagram illustrating a transceiver according to a third embodiment of the present invention.

Please refer to FIG. 6, which is a diagram illustrating a transceiver 600 according to a third embodiment of the present invention. The transceiver 600 comprises a first mixing circuit 602, a first transforming network 604, a power amplifier (PA) 606, a switching circuit 608, a second transforming network 610, a low-noise amplifying circuit (LNA) 612, and a second mixing circuit 614. An antenna 616, a band-pass filter 618, and a co-matching circuit 620 are also shown in FIG. 6 to more clearly illustrate the transceiver 600. According to the exemplary embodiment, the first mixing circuit 602, the first transforming network 604, the power amplifier 606, the switching circuit 608, the second transforming network 610, the low-noise amplifying circuit (LNA) 612, and the second mixing circuit 614 are configured as a single chip or a system-on-chip (SOC).

The transceiver 600 illustrates the detailed schematic of the above-mentioned transceiver 100. The transceiver 600 is a differential transceiver. Therefore, all the signals recited in the transceiver 100 will be differential signals comprising a first polarity signal (i.e. the positive signal "+") and a second polarity signal (i.e. the negative signal "−").

The first mixing circuit 602 is arranged to generate a first modulated signal Sm1+, Sm1− according to a first input signal Sin1+, Sin1− during the transmitting mode of the first communication standard and generate a second modulated signal Sm2+, Sm2− according to a second input signal Sin2+, Sin2− during the transmitting mode of the second communication standard. The first transforming network 604 is arranged to transform the first modulated signal Sm1+, Sm1− into a first transformed signal St1+, St1− according to a first winding turns ratio NR1 during the transmitting mode of the first communication standard, and transform the second modulated signal Sm2+, Sm2− into a second transformed signal St2+, St2− according to a second winding turns ratio NR2 during the transmitting mode of the second communication standard. The power amplifier 606 is arranged to generate a first RF (Radio frequency) signal Srf1+, Srf1− to a connecting port Np+, Np−, respectively, of the transceiver 600 according to the first transformed signal St1+, St1− during the transmitting mode of the first communication standard. The second transforming network 610 is coupled between the switching circuit 608 and the connecting port Np+, Np− for transforming the second transformed signal St2+, St2− into a second RF signal Srf2+, Srf2− on the connecting port Np+, Np−, respectively, during the transmitting mode of the second communication standard. The switching circuit 608 is coupled between the first transforming network 604 and the connecting port Np+, Np− for coupling the second transformed signal St2+, St2− to the connecting port Np+, Np−, respectively, during the transmitting mode of the second communication standard, and not coupling the second transformed signal St2+, St2− to the connecting port Np+, Np− during the transmitting mode of the first communication standard.

The second transforming network 610 is further arranged to transform a third RF signal Srf3+, Srf3− received on the connecting port Np+, Np−, respectively, into a third transformed signal St3+, St3− during a receiving mode of the first communication standard, and transform a fourth RF signal Srf4+, Srf4− received on the connecting port Np+, Np−, respectively, into a fourth transformed signal St4+, St4− during the receiving mode of the second communication standard. The low-noise amplifying circuit 612 is arranged to receive the third transformed signal St3+, St3− to generate a first low-noise signal Sln1+, Sln1− during the receiving mode of the first communication standard, and receive the fourth transformed signal St4+, St4− to generate a second low-noise signal Sln2+, Sln2− during the receiving mode of the second communication standard. The second mixing circuit 614 is arranged to generate a third modulated signal Sm3+, Sm3− according to the first low-noise signal Sln1+, Sln1− during the receiving mode of the first communication standard and generate a fourth modulated signal Sm4+, Sm4− according to the second low-noise signal Sln2+, Sln2− during the receiving mode of the second communication standard.

The first transforming network 604 comprises a primary windings 6042 and a secondary windings 6044. The primary windings 6042 is arranged to receive the first modulated signal Sm1+, Sm1− during the transmitting mode of the first communication standard, and receive the second modulated signal Sm2+, Sm2− during the transmitting mode of the second communication standard. The secondary windings 6044 is magnetically coupled to the primary windings 6042, and is arranged to generate the first transformed signal St1+, St1− on a first output terminals No1+, No1−, respectively, of the secondary windings 6044 during the transmitting mode of the first communication standard, and generate the second transformed signal St2+, St2− on a second output terminals No2+, No2−, respectively, of the secondary windings 6044 during the transmitting mode of the second communication standard. According to this embodiment, the effective winding turns of the secondary windings 6044 between the terminals No1+ and No1− is larger than the effective winding turns of the secondary windings 6044 between the terminals No2+ and No2−. Therefore, the first winding turns ratio NR1 of the effective winding turns of the secondary windings 6044 between the terminals No1+ and No1− over the winding turns of the primary windings 6042 is larger than the second winding turns ratio NR2 of the effective winding turns of the secondary windings 6044 between the terminals No2+ and No2− over the winding turns of the primary windings 6042.

The second transforming network 610 comprises an inductive circuit 6102, a first capacitive circuit 6104, and a second capacitive circuit 6106. The inductive circuit 6102 has a first terminal N1+ arranged to receive the first polarity signal, i.e. St2+, during the transmitting mode of the second communication standard and having a second terminal N1− arranged to receive the second polarity signal, i.e. St2+, during the transmitting mode of the second communication standard. The first capacitive circuit 6104 has a first terminal coupled to the first terminal N1+ of the inductive circuit 6102, and a second terminal coupled to a first terminal, i.e. Np+, of the connecting port Np+, Np−. The second capacitive circuit 6106 has a first terminal coupled to the second terminal N1− of the inductive circuit 6102, and a second terminal coupled to a second terminal, i.e. Np−, of the connecting port Np+, Np−. In addition, the second RF signal Srf2+, Srf2− comprises a first polarized RF signal, i.e. Srf2+, and a second polarized RF signal, i.e. Srf2−, the first terminal, i.e. Np+, of the connecting port Np+, Np− is arranged to output the first polarized RF signal Srf2+, and the second terminal, i.e. Np−, of the connecting port Np+, Np− is arranged to output the second polarized RF signal Srf2−.

The switching circuit 608 comprises a first switch 6082 and a second switch 6084, wherein the first switch 6082 and the second switch 6084 are implemented by two respective field-effect transistors. The first switch 6082 has a first connecting terminal coupled to the terminal No2+, a second connecting terminal coupled to the terminal N1+, and a controlling terminal coupled to the control signal Sc. The second switch 6084 has a first connecting terminal coupled to the terminal No2−, a second connecting terminal coupled to the terminal N1−, and a controlling terminal coupled to the control signal Sc.

The band-pass filter (BPF) 618 is coupled between the antennal 616 and the connecting port Np+, Np−. The band-pass filter 618 is powered by a supply voltage Vdd. The co-matching circuit 620 is implemented by a capacitive circuit having a first terminal coupled to the terminal Np+ and a second terminal coupled to the terminal Np−.

A local oscillator (LO) 622 is arranged to generate an oscillating signal Sosc. The oscillating signal Sosc is provided to the first mixing circuit 602 and the second mixing circuit 614 for performing the respective modulations. It is noted that the oscillating signal Sosc may be first phase-shifted/divided into two differential oscillating signals Sosc+, Sosc− by a first divider 624, and then provided to the first mixing circuit 602. Similarly, the oscillating signal Sosc may also be first phase-shifted/divided into an in-phase oscillating signals Sosc_in and a quadrature oscillating signal Sosc_qua by a second divider 626, and then provided to the second mixing circuit 614. A detailed description of the operation of the local oscillator 622, the first divider 624 and the second divider 626 is omitted here for brevity.

As the transceiver 600 illustrates the detailed schematic of the above-mentioned transceiver 100, the operating modes of the transceiver 600 are similar to the operating modes (i.e. the above mentioned four modes) transceiver 100, and the detailed description is therefore omitted here for brevity.

According to the third embodiment, the chip area of the transceiver 600 is greatly reduced because the transceiver 600 is a highly integrated two-system transceiver in comparison to conventional counterpart.

Figure 7:
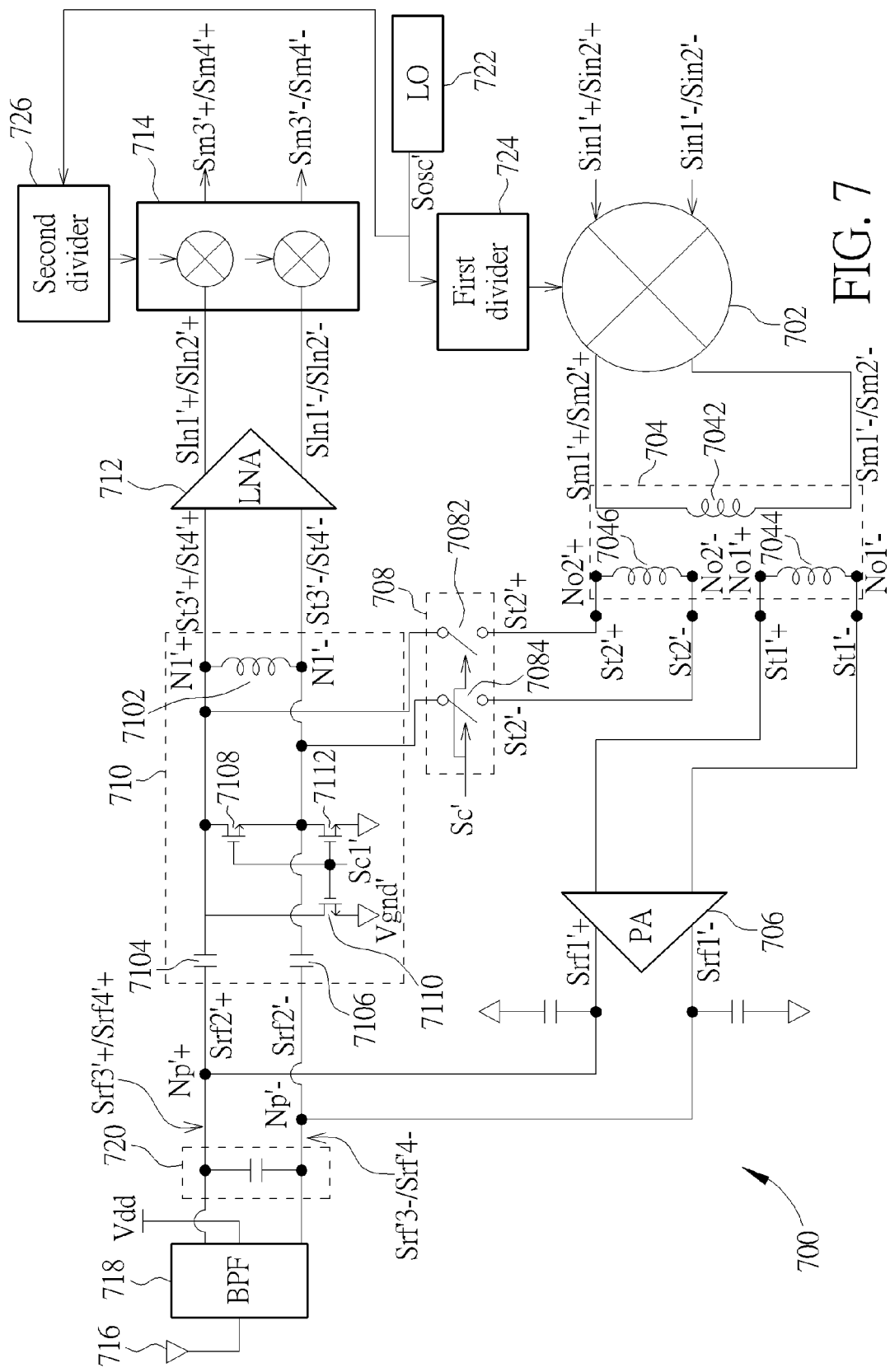
FIG. 7 is a diagram illustrating a transceiver according to a fourth embodiment of the present invention.

Please refer to FIG. 7, which is a diagram illustrating a transceiver 700 according to a fourth embodiment of the present invention. The transceiver 700 comprises a first mixing circuit 702, a first transforming network 704, a power amplifier 706, a switching circuit 708, a second transforming network 710, a low-noise amplifying circuit 712, and a second mixing circuit 714. Moreover, an antenna 716, a band-pass filter 718, and a co-matching circuit 720 are also shown in FIG. 7 to more clearly illustrate the transceiver 700. According to the exemplary embodiment, the first mixing circuit 702, the first transforming network 704, the power amplifier 706, the switching circuit 708, the second transforming network 710, the low-noise amplifying circuit 712, and the second mixing circuit 714 are configured as a single chip or a system-on-chip (SOC).

The transceiver 700 illustrates another detailed schematic of the above-mentioned transceiver 100. The transceiver 700 is a differential transceiver. Therefore, all the signals recited in the transceiver 100 will be differential signals comprising a first polarity signal (i.e. the positive signal "+") and a second polarity signal (i.e. the negative signal "−").

The first mixing circuit 702 is arranged to generate a first modulated signal Sm1'+, Sm1'− according to a first input signal Sin1'+, Sin1'− during the transmitting mode of the first communication standard and generate a second modulated signal Sm2'+, Sm2'− according to a second input signal Sin2'+, Sin2'− during the transmitting mode of the second communication standard. The first transforming network 704 is arranged to transform the first modulated signal Sm1'+, Sm1'− into a first transformed signal St1'+, St1'− according to a first winding turns ratio NR1' during the transmitting mode of the first communication standard, and transform the second modulated signal Sm2'+, Sm2'− into a second transformed signal St2'+, St2'− according to a second winding turns ratio NR2' during the transmitting mode of the second communication standard. During the transmitting mode of the first communication standard, the power amplifier 706 is arranged to respectively generate first RF (Radio frequency) signals Srf1'+ and Srf1'− to connecting ports Np'+ and Np'−, of the transceiver 700, according to the first transformed signals St1'+ and St1'−. During the transmitting mode of the second communication standard, the second transforming network 710 is coupled between the switching circuit 708 and the connecting ports Np'+ and Np'− for respectively transforming the second transformed signals St2'+ and St2'− into second RF signals Srf2'+ and Srf2'− on the connecting ports Np'+ and Np'−. The switching circuit 708 is coupled between the first transforming network 704 and the connecting ports Np'+, Np'− for coupling the second transformed signals St2'+, St2'− to the connecting ports Np'+, Np'−, respectively, during the transmitting mode of the second communication standard, and not coupling the second transformed signals St2'+, St2'− to the connecting ports Np'+, Np'− during the transmitting mode of the first communication standard.

The second transforming network 710 is further arranged to transform a third RF signal Srf3'+, Srf3'− received on the connecting ports Np'+, Np'−, respectively, into a third transformed signal St3'+, St3'− during a receiving mode of the first communication standard, and transform a fourth RF signal Srf4'+, Srf4'− received on the connecting ports Np'+, Np'−, respectively, into a fourth transformed signal St4'+, St4'− during the receiving mode of the second communication standard. The low-noise amplifying circuit 712 is arranged to receive the third transformed signal St3'+, St3'− to generate a first low-noise signal Sln1'+, Sln1'− during the receiving mode of the first communication standard, and receive the fourth transformed signal St4'+, St4'− to generate a second low-noise signal Sln2'+, Sln2'− during the receiving mode of the second communication standard. The second mixing circuit 714 is arranged to generate a third modulated signal Sm3'+, Sm3'− according to the first low-noise signal Sln1'+, Sln1'− during the receiving mode of the first communication standard and generate a fourth modulated signal Sm4'+, Sm4'− according to the second low-noise signal Sln2'+, Sln2'− during the receiving mode of the second communication standard.

The first transforming network 704 comprises a primary windings 7042, a first secondary windings 7044, and a second secondary windings 7046. The primary windings 7042 is arranged to receive the first modulated signal Sm1'+, Sm1'− during the transmitting mode of the first communication standard, and receive the second modulated signal Sm2'+, Sm2'− during the transmitting mode of the second communication standard. The first secondary windings 7044 is magnetically coupled to the primary windings 7042, and is arranged to generate the first transformed signal St1'+, St1'− on a first output terminals No1'+, No1'−, respectively, of the first secondary windings 7044 during the transmitting mode of the first communication standard. The second secondary windings 7046 is magnetically coupled to the primary windings 7042, and is arranged to generate the second transformed signal St2'+, St2'− on a second output terminals No2'+, No2'−, respectively, of the second secondary windings 7046 during the transmitting mode of the second communication standard. According to this embodiment, the winding turns of the first secondary windings 7044 are more than the winding turns of the second secondary windings 7046. Therefore, the first winding turns ratio NR1' of the first secondary windings 7044 to the winding turns of the primary windings 7042 is larger than the second winding turns ratio NR2 of the second secondary windings 7046 to the winding turns of the primary windings 7042.

The second transforming network 710 comprises an inductive circuit 7102, a first capacitive circuit 7104, a second capacitive circuit 7106, a first transistor 7108, a second transistor 7110, and a third transistor 7112. The inductive circuit 7102 has a first terminal N1'+ arranged to receive the first polarity signal, i.e. St2'+, during the transmitting mode of the second communication standard and a second terminal N1'− arranged to receive the second polarity signal, i.e. St2'+, during the transmitting mode of the second communication standard. The first capacitive circuit 7104 has a first terminal coupled to the first terminal N1'+ of the inductive circuit 7102, and a second terminal coupled to a first terminal, i.e. Np'+, of the connecting ports Np'+, Np'−. The second capacitive circuit 7106 has a first terminal coupled to the second terminal N1'− of the inductive circuit 7102, and a second terminal coupled to a second terminal, i.e. Np'−, of the connecting ports Np'+, Np'−. In addition, the second RF signal Srf2'+, Srf2'− comprises a first polarized RF signal, i.e. Srf2'+, and a second polarized RF signal, i.e. Srf2'−, the first terminal, i.e. Np'+, of the connecting ports Np'+, Np'− is arranged to output the first polarized RF signal Srf2'+, and the second terminal, i.e. Np'−, of the connecting ports Np'+, Np'− is arranged to output the second polarized RF signal Srf2'−.

The first transistor 7108 has a first connecting terminal coupled to the first terminal N1'+ of the inductive circuit 7102, a second connecting terminal coupled to the second terminal N1'− of the inductive circuit 7102, and a controlling terminal coupled to a control signal Sc1'. The second transistor 7110 has a first connecting terminal coupled to the first terminal N1'+ of the inductive circuit 7102, a second connecting terminal coupled to a reference voltage Vgnd', and a controlling terminal coupled to the control signal Sc1'. The third transistor 7112 has a first connecting terminal coupled to the second terminal N1'− of the inductive circuit 7102, a second connecting terminal coupled to the reference voltage Vgnd', and a controlling terminal coupled to the control signal Sc1'. The control signal Sc1' is arranged to turn on the first transistor 7108, the second transistor 7110, and the third transistor 7112 during the transmitting mode of the first communication standard, and turn off the first transistor 7108, the second transistor 7110, and the third transistor 7112 during the transmitting mode of the second communication standard. Accordingly, the first terminal N1'+ and the second terminal N1'− are connected to the reference voltage Vgnd, i.e. the ground voltage, during the transmitting mode of the first communication standard. When the first terminal N1'+ and the second terminal N1'− are connected to the ground voltage, there is no signal inputted to the low-noise amplifying circuit 712 during the transmitting mode of the first communication standard.

The switching circuit 708 comprises a first switch 7082 and a second switch 7084, wherein the first switch 7082 and the second switch 7084 are also implemented by two field-effect transistors respectively. The first switch 7082 has a first connecting terminal coupled to the terminal No2'+, a second connecting terminal coupled to the terminal N1'+, and a controlling terminal coupled to the control signal Sc'. The second switch 7084 has a first connecting terminal coupled to the terminal No2'−, a second connecting terminal coupled to the terminal N1'−, and a controlling terminal coupled to the control signal Sc'.

The band-pass filter 718 is coupled between the antennal 716 and the connecting ports Np'+ and Np'−. The band-pass filter 718 is powered by a supply voltage Vdd'. The co-matching circuit 720 is implemented by a capacitive circuit having a first terminal coupled to the terminal Np'+ and a second terminal coupled to the terminal Np'−.

A local oscillator 722 is arranged to generate an oscillating signal Sosc'. The oscillating signal Sosc' is provided to the first mixing circuit 702 and the second mixing circuit 714 for performing the respective modulations. It is noted that the oscillating signal Sosc' may be first phase-shifted/divided into two differential oscillating signals Sosc'+, Sosc'− by a first divider 724, and then provided to provide to the first mixing circuit 702. Similarly, the oscillating signal Sosc' may also be first phase-shifted/divided into an in-phase oscillating signals Sosc_in' and a quadrature oscillating signal Sosc_qua' by a second divider 726, and then provided to the second mixing circuit 714. Detailed descriptions of the operation of the local oscillator 722, the first divider 724 and the second divider 726 are omitted here for brevity.

As the transceiver 700 illustrates another detailed schematic of the above-mentioned transceiver 100, the operating modes of the transceiver 700 are similar to the operating modes (i.e. the above mentioned four modes) transceiver 100, and the detailed description is omitted here for brevity.

According to the third embodiment, the chip area of the transceiver 700 is greatly reduced because the transceiver 600 is a highly integrated two-system transceiver in comparison to conventional counterpart.

Figure 8:
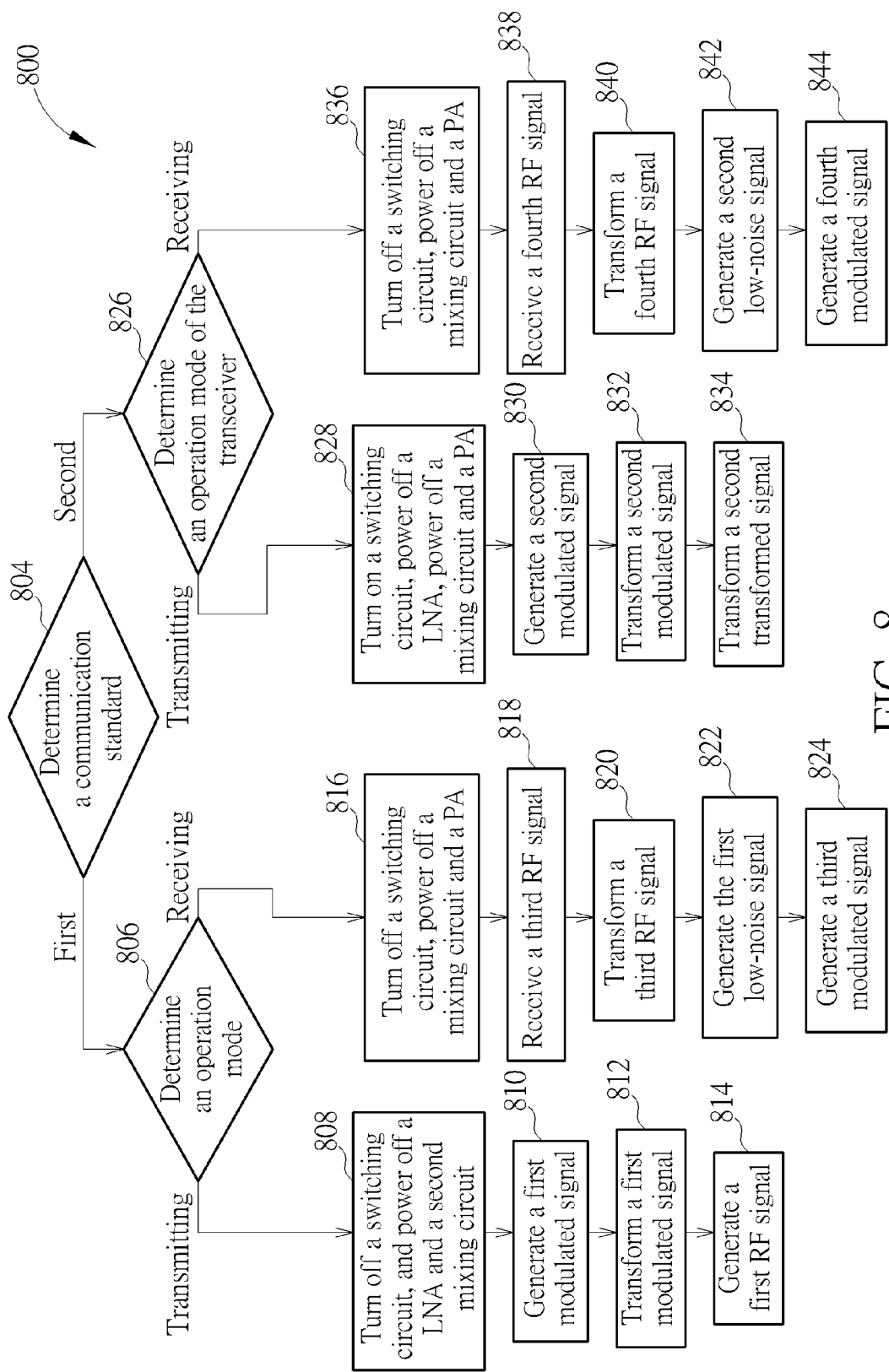
FIG. 8 is a flowchart illustrating a method of controlling a transceiver according to a fifth embodiment of the present invention.

The operation of the above mentioned embodiments can be summarized into the steps of FIG. 8. FIG. 8 is a flowchart illustrating a method 800 of controlling a transceiver (e.g. the transceivers 100, 500, 600, 700) according to a fifth embodiment of the present invention. For brevity, the description of the method 800 in the following paragraphs is described in conjunction with the transceiver 100. Provided that substantially the same result is achieved, the steps of the flowchart shown in FIG. 8 need not be in the exact order shown and need not be contiguous; that is, other steps can be intermediate. The method 800 comprises:

Step 804: Determine the communication standard of the transceiver 100, if the transceiver 100 operates under the first communication standard, go to step 806; if the transceiver 100 operates under the second communication standard, go to step 826;

Step 806: Determine the operation mode of the transceiver 100, if the transceiver 100 operates under the transmitting mode, go to step 808; if the transceiver 100 operates under the receiving mode, go to step 816;

Step 808: Turn off the switching circuit 108, power off the low-noise amplifying circuit 112, and power off the second mixing circuit 114;

Step 810: Use the first mixing circuit 102 to generate the first modulated signal Sm1 according to the first input signal Sin1;

Step 812: Use the first transforming network 104 to transform the first modulated signal Sm1 into the first transformed signal St1 according to the first winding turns ratio NR1;

Step 814: Use the power amplifier 106 to generate the first RF signal Srf1 to the antenna 116 according to the first transformed signal St1;

Step 816: Turn off the switching circuit 108, power off the mixing circuit 102, and power off the power amplifier 106;

Step 818: Receive the third RF signal Srf3 on the connecting port Np from the antenna 116;

Step 820: Use the second transforming network 110 to transform the third RF signal Srf3 into the third transformed signal St3;

Step 822: Use the low-noise amplifying circuit 112 to generate the first low-noise signal Sln1 according to the third transformed signal St3;

Step 824: Use the second mixing circuit 114 to generate the third modulated signal Sm3 according to the first low-noise signal Sln1;

Step 826: Determine the operation mode of the transceiver 100, if the transceiver 100 operates under the transmitting mode, go to step 828; if the transceiver 100 operates under the receiving mode, go to step 836;

Step 828: Turn on the switching circuit 108, power off the low-noise amplifying circuit 112, power off the second mixing circuit 114, and power off the power amplifier 106;

Step 830: Use the first mixing circuit 102 to generate the second modulated signal Sm2 according to the second input signal Sin2;

Step 832: Use the first transforming network 104 to transform the second modulated signal Sm2 into the second transformed signal St2 according to the first winding turns ratio NR2;

Step 834: Use the second transforming network 110 to transform the second transformed signal St2 into the second RF signal Srf2 on the connecting port Np for the antenna 116;

Step 836: Turn off the switching circuit 108, power off the mixing circuit 102, and power off the power amplifier 106;

Step 838: Receive the fourth RF signal Srf4 on the connecting port Np from the antenna 116;

Step 840: Use the second transforming network 110 to transform the fourth RF signal Srf4 into the fourth transformed signal St4;

Step 842: Use the low-noise amplifying circuit 112 to generate the second low-noise signal Sln2 according to the fourth transformed signal St4;

Step 844: Use the second mixing circuit 114 to generate the fourth modulated signal Sm4 according to the second low-noise signal Sln2.

According to the method 800, the operation of the transceiver 100 is scheduled into four non-concurrent modes, i.e. the transmitting mode of the first communication standard (steps 808-814), the receiving mode of the first communication standard (steps 816-824), the transmitting mode of the second communication standard (steps 828-834), and the receiving mode of the second communication standard (steps 836-844).

Briefly, according to the above mentioned embodiment (e.g. the transceivers 100, 500, 600, 700), as the first mixing circuit is concurrently used by the transmitting modes of the first and the second communication standards, the first transforming network is partly concurrently used by the transmitting modes of the first and the second communication standards, and the low-noise amplifying circuit and the second mixing circuit are concurrently used by the receiving modes of the first and the second communication standards, the chip area of the transceiver is greatly reduced because the transceiver is a highly integrated two-system transceiver in comparison to its conventional counterpart.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transceiver, comprising:
    a first transforming network, having a first input impedance, a first output impedance, and a second output impedance, arranged for using the first input impedance to receive a first modulated signal and using the first output impedance to output a first transformed signal during a transmitting mode of a first communication standard, and for using the first input impedance to receive a second modulated signal and using the second output impedance to output a second transformed signal during the transmitting mode of a second communication standard;
    a second transforming network, having a second input impedance and a third output impedance, arranged for using the second input impedance to receive the second transformed signal and using the third output impedance to output a first RF signal to a connecting port of the transceiver during the transmitting mode of the second communication standard;
    a power amplifier, arranged to generate a second RF (Radio frequency) signal to the connecting port of the transceiver according to the first transformed signal during the transmitting mode of the first communication standard; and
    a switching circuit, coupled between the first transforming network and the second transforming network, for coupling the second transformed signal to the second transforming network during the transmitting mode of the second communication standard, and not coupling the second transformed signal to the second transforming network during the transmitting mode of the first communication standard.

2. The transceiver of claim 1, wherein the power amplifier is turned off during the transmitting mode of the second communication standard.

3. The transceiver of claim 1, wherein the first transforming network comprises:
    a primary windings, arranged to receive the first modulated signal during the transmitting mode of the first communication standard, and receive the second modulated signal during the transmitting mode of the second communication standard; and
    a secondary windings, magnetically coupled to the primary windings, arranged to generate the first transformed signal on a first output terminal of the secondary windings during the transmitting mode of the first communication standard, and generate the second transformed signal on a second output terminal of the secondary windings during the transmitting mode of the second communication standard.

4. The transceiver of claim 1, wherein the first transforming network comprises:
    a primary windings, arranged to receive the first modulated signal during the transmitting mode of the first communication standard, and receive the second modulated signal during the transmitting mode of the second communication standard;
    a first secondary windings, magnetically coupled to the primary windings, arranged to generate the first transformed signal on an output terminal of the first secondary windings during the transmitting mode of the first communication standard; and
    a second secondary windings, magnetically coupled to the primary windings, arranged to generate the second transformed signal on an output terminal of the second secondary windings during the transmitting mode of the second communication standard.

5. The transceiver of claim 1, further comprising:
    a mixing circuit, arranged to generate the first modulated signal according to a first input signal during the transmitting mode of the first communication standard and generate the second modulated signal according to a second input signal during the transmitting mode of the second communication standard.

6. The transceiver of claim 1, wherein during the transmitting mode of the first communication standard, if an output power of the first transformed signal is lower than a predetermined power level, then the first transforming network is arranged to use the first input impedance to receive the first modulated signal and to use the second output impedance to output a third transformed signal to the second transforming network for transforming the third transformed signal to the connecting port, and the power amplifier is power-off.

7. The transceiver of claim 1, wherein during the transmitting mode of the second communication standard, if an output power of the second transformed signal is higher than a predetermined power level, then the first transforming network is arranged to use the first input impedance to receive the second modulated signal and to use the first output impedance to output a fourth transformed signal to the power amplifier for amplifying the fourth transformed signal to the connecting port, and the switching circuit is opened.

8. The transceiver of claim 1, wherein the second transforming network is further arranged to transform a third RF signal received on the connecting port into a third transformed signal during a receiving mode of the first communication standard, and transform a fourth RF signal received on the connecting port into a fourth transformed signal during the receiving mode of the second communication standard.

9. The transceiver of claim 8, wherein the power amplifier is powered off during the receiving mode of the first communication standard and the receiving mode of the second communication standard.

10. The transceiver of claim 8, further comprising:
a low-noise amplifying circuit, arranged to receive the third transformed signal to generate a first low-noise signal during the receiving mode of the first communication standard, and receive the fourth transformed signal to generate a second low-noise signal during the receiving mode of the second communication standard; and
a mixing circuit, arranged to generate a third modulated signal according to the first low-noise signal during the receiving mode of the first communication standard and generate a fourth modulated signal according to the second low-noise signal during the receiving mode of the second communication standard.

11. The transceiver of claim 10, wherein at least one of the low-noise amplifying circuit and the mixing circuit is powered off during the transmitting mode of the first communication standard and the transmitting mode of the second communication standard.

12. The transceiver of claim 8, wherein the switching circuit is arranged to not couple the first transforming network to the second transforming network during the receiving mode of the first communication standard and the receiving mode of the second communication standard.

13. A transceiver, comprising:
a first transforming network, arranged to transform a first modulated signal into a first transformed signal according to a first winding turns ratio during a transmitting mode of a first communication standard, and transform a second modulated signal into a second transformed signal according to a second winding turns ratio during the transmitting mode of a second communication standard;
a power amplifier, arranged to generate a first RF (Radio frequency) signal to a connecting port of the transceiver according to the first transformed signal during the transmitting mode of the first communication standard; and
a switching circuit, coupled between the first transforming network and the connecting port, for coupling the second transformed signal to the connecting port during the transmitting mode of the second communication standard, and not coupling the second transformed signal to the connecting port during the transmitting mode of the first communication standard.

14. The transceiver of claim 13, wherein the first winding turns ratio is larger than the second winding turns ratio.

15. The transceiver of claim 13, wherein the first transforming network comprises:
a primary windings, arranged to receive the first modulated signal during the transmitting mode of the first communication standard, and receive the second modulated signal during the transmitting mode of the second communication standard; and
a secondary windings, magnetically coupled to the primary windings, arranged to generate the first transformed signal on a first output terminal of the secondary windings during the transmitting mode of the first communication standard, and generate the second transformed signal on a second output terminal of the secondary windings during the transmitting mode of the second communication standard.

16. The transceiver of claim 13, wherein the first transforming network comprises:
a primary windings, arranged to receive the first modulated signal during the transmitting mode of the first communication standard, and receive the second modulated signal during the transmitting mode of the second communication standard;
a first secondary windings, magnetically coupled to the primary windings, arranged to generate the first transformed signal on an output terminal of the first secondary windings during the transmitting mode of the first communication standard; and
a second secondary windings, magnetically coupled to the primary windings, arranged to generate the second transformed signal on an output terminal of the second secondary windings during the transmitting mode of the second communication standard.

17. The transceiver of claim 13, further comprising:
a second transforming network, coupled between the switching circuit and the connecting port, for transforming the second transformed signal into a second RF signal on the connecting port during the transmitting mode of the second communication standard.

18. The transceiver of claim 17, wherein the second transforming network is further arranged to transform a third RF signal received on the connecting port into a third transformed signal during a receiving mode of the first communication standard, and transform a fourth RF signal received on the connecting port into a fourth transformed signal during the receiving mode of the second communication standard.

19. The transceiver of claim 18, wherein the switching circuit is arranged to not couple the first transforming network to the second transforming network during the receiving mode of the first communication standard and the receiving mode of the second communication standard.

20. A method of controlling a transceiver, the method comprising:
when the transceiver operates under a first communication standard:
using a first transforming network to transform a first modulated signal into a first transformed signal according to a first winding turns ratio during a transmitting mode; and
using a power amplifier to generate a first RF (Radio frequency) signal to a connecting port of the transceiver according to the first transformed signal during the transmitting mode; and
when the transceiver operates under a second communication standard:
using the first transforming network to transform a second modulated signal into a second transformed signal according to a second winding turns ratio during the transmitting mode; and
coupling the second transformed signal to the connecting port during the transmitting mode;
wherein the second transformed signal is not coupled to the connecting port during the transmitting mode of the first communication standard.

21. The method of claim 20, wherein the first winding turns ratio is larger than the second winding turns ratio.

22. The method of claim 20, further comprising:
using a second transforming network to transform the second transformed signal into a second RF signal on the connecting port during the transmitting mode of the second communication standard.

23. The method of claim 22, further comprising:
using the second transforming network to transform a third RF signal received on the connecting port into a third transformed signal during a receiving mode of the first communication standard; and
using the second transforming network to transform a fourth RF signal received on the connecting port into a fourth transformed signal during the receiving mode of the second communication standard.

24. The method of claim 22, further comprising:
not coupling the first transforming network to the second transforming network during the receiving mode of the first communication standard and the receiving mode of the second communication standard.

* * * * *